(12) United States Patent
Zeng et al.

(10) Patent No.: US 9,614,176 B2
(45) Date of Patent: Apr. 4, 2017

(54) ENCAPSULATION METHOD OF OLED AND A STRUCTURE OF OLED

(71) Applicant: Shenzhen China Star Optoelectronics Technology Co., Ltd., Shenzhen, Guangdong (CN)

(72) Inventors: Weijing Zeng, Guangdong (CN); Yawei Liu, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 168 days.

(21) Appl. No.: 14/426,375

(22) PCT Filed: Sep. 22, 2014

(86) PCT No.: PCT/CN2014/087078
§ 371 (c)(1),
(2) Date: Mar. 5, 2015

(87) PCT Pub. No.: WO2016/041212
PCT Pub. Date: Mar. 24, 2016

(65) Prior Publication Data
US 2016/0254481 A1    Sep. 1, 2016

(30) Foreign Application Priority Data
Sep. 16, 2014   (CN) .......................... 2014 1 0472086

(51) Int. Cl.
*H01L 51/52* (2006.01)
*H01L 51/00* (2006.01)
*H01L 51/56* (2006.01)

(52) U.S. Cl.
CPC ...... *H01L 51/5246* (2013.01); *H01L 51/0034* (2013.01); *H01L 51/0081* (2013.01);
(Continued)

(58) Field of Classification Search
CPC . H01L 51/5246; H01L 51/56; H01L 51/5259; H01L 51/0094; H01L 51/0037; H01L 51/0081
See application file for complete search history.

(56) References Cited

U.S. PATENT DOCUMENTS

2003/0170496 A1* 9/2003 Hieda ................... H01L 51/524
428/690
2012/0318023 A1 12/2012 Shimomura

FOREIGN PATENT DOCUMENTS

| CN | 1617636 A | 5/2005 | |
| DE | WO 2013034238 A1 * | 3/2013 | ........... C07D 401/14 |
| JP | 200816300 A | 1/2006 | |

* cited by examiner

*Primary Examiner* — Joseph L Williams
(74) *Attorney, Agent, or Firm* — Andrew C. Cheng

(57) ABSTRACT

The invention provides an encapsulation method of OLED and a structure of OLED, and the method comprises: step 1: providing a glass cover and an encapsulating substrate, and the glass cover comprising a display area and an edge area surrounding the display area; step 2: forming a layer of $SiN_x$ on the edge area of the glass cover; step 3: self-arranging a layer of hydrophobic monomer on the display area surface of the glass cover; step 4: coating a circle of glue frame around the display area on the glass cover; step 5: coating desiccant on the layer of hydrophobic monomer on the display area of the glass cover; step 6: attaching the glass cover correspondingly to the substrate in vacuum environment; step 7: illuminating by UV light to cure the glue frame to achieve the glass cover encapsulating the substrate.

11 Claims, 5 Drawing Sheets

(52) U.S. Cl.
CPC .......... *H01L 51/0094* (2013.01); *H01L 51/52* (2013.01); *H01L 51/5259* (2013.01); *H01L 51/56* (2013.01); *H01L 2251/301* (2013.01)

ENCAPSULATION METHOD OF OLED AND A STRUCTURE OF OLED

FIELD OF THE INVENTION

The invention relates to a technical field of liquid crystal, in particular to an encapsulation method of OLED and a structure of OLED.

BACKGROUND OF THE INVENTION

OLED is an Organic Light-Emitting Diode with characters of self-illuminating, high-brightness, wide viewing angle, high contrast, flexibility, and low energy consumption, so instead of traditional crystal display, this new generation display getting wide attention is applied widely in mobile screens, computer displays and full-color televisions. OLED display technologies, which is different from LCD display technologies, apply very thin organic material coating and glass substrate, and then these organic materials illuminate without backlight while current pass. However, due to organic material's easy reaction with hydrogen and oxygen, as being display equipment of organic material, the criteria of encapsulation of OLED display is very high. In order to cast commercial of OLED display, relative encapsulating technologies become research spotlight.

Common encapsulating technologies are curing glue frame from ultraviolet (UV) light, laser sealing of glass powder, face seal, dam and fill of glue frame and desiccant, film sealing and etc. Mention to dam and fill of glue frame and desiccant, how to make the desiccant dam on complete display without destroying the glue frame at the edge in the encapsulating technology to reach the best encapsulating effect is the direction researchers striving for. The most important point of filling the complete display with desiccant is good adhesion of desiccant spreadability on the interface of glass. The spreadability of liquid on interface is relative to the character of the interface. Polar liquid has better spreadability in a hydrophilic interface (smaller contact angle), but has worse spreadability in a hydrophobic interface (larger contact angle); in contrast, non-polar liquid has worse spreadability in hydrophilic interface, but better spreadability in hydropholic interface. After cleaning, an interface of common glass covers is a hydrophilic interface, thereby most liquid desiccant for usage is non-polar organics. Therefore, the spreadability of desiccant is worse in common situation, and causing uneven distribution of desiccant on production, fill incompletely in some portion, and even causing glue confliction situation because bobbles cannot be ejected on time due to uneven distribution of liquid desiccant when sudden attachment occurs.

SUMMARY

The proposal of the invention is providing an encapsulation method of OLED. In order to change spreadability of the glass cover interface, to have well spreadability from desiccant on the glass cover interface, and to improve encapsulating effect of OLED display, the glass cover interface is modified from hydrophilic interface to hydrophobic interface by a self-arranging method of glass surface.

Another proposal of the invention is providing an OLED structure, which is self-arranging a layer of hydrophobic monomer on the glass cover first, and then coating liquid desiccant to have the glass cover interface modified from hydrophilic interface to hydrophobic interface because of the layer of hydrophobic monomer to provide well spreadability from the liquid desiccant on the glass cover, and finally improve the encapsulating effect of OLED display.

To achieve the proposal above, the invention provides an encapsulation method of OLED, comprising steps as following:

step 1: providing a glass cover and an encapsulating substrate, and the glass cover comprising a display area and an edge area surrounding the display area;

step 2: forming a layer of $SiN_x$ on the edge area of the glass cover;

step 3: self-arranging a layer of hydrophobic monomer on the display area surface of the glass cover;

step 4: coating a circle of glue frame around the display area on the glass cover;

step 5: coating desiccant on the layer of hydrophobic monomer on the display area of the glass cover;

step 6: attaching the glass cover correspondingly to the substrate;

step 7: illuminating by UV light to cure the glue frame to achieve the glass cover encapsulating the substrate.

The substrate can be an OLED substrate; a method of self-arranging the layer of hydrophobic monomer in the step 3 is solution immersion method or evaporation.

The layer of hydrophobic monomer in the step 3 is silane-system molecular, which is n-propyltrichlorosilane, Trichlorooctadecylsilane, Trichlorodecylsilane, n-Decyltrimethoxysilane, n-Decyltriethoxysilane, or n-Decyltri(methoxyethoxy)silane.

The glue frame is coated at the edge of the glass cover in the step 4, and a space is kept from the display area; the glue frame is UV glue.

Screen printing is applied in coating desiccant in the step 5; the step 6 is processing in vacuum environment.

The desiccant is curable desiccant or non-curable desiccant.

The non-curable desiccant is aluminum polymer, which is $[R-O-Al=O]_n$ ($n \geq 1$); the curable desiccant is thermo setting liquid desiccant or UV curing liquid desiccant.

When the desiccant is curable desiccant in step 5, heating or UV light illuminating for curing is processing after coating.

The invention further provides an OLED structure, comprising a substrate, a glass cover tightly attached to the substrate, and a glue frame positioned between the substrate and the glass cover, which includes a display area and an edge area surrounding the display area, and further includes a layer of $SiN_x$ positioned on the edge area of the glass cover, a layer of hydrophobic monomer self-arranging on the display area surface of the glass cover, and desiccant coated on the layer of hydrophobic monomer on the display area of the glass cover. The substrate is OLED substrate; the layer of hydrophobic monomer is silane-system molecular; the glue frame, which is UV glue, is coated at the edge of the glass cover, and a space is kept from the display area; the desiccant is curable desiccant or non-curable desiccant.

The advantage effect of the invention: by a self-arranging method of glass surface, an encapsulation method and a structure of OLED of the invention self-arrange a layer of hydrophobic monomer on the glass cover surface to have the glass cover surface modified from hydrophilic interface to hydrophobic interface, and to have well spreadability from the liquid desiccant on the glass cover interface, to avoid causing glue confliction situation because bobbles cannot be ejected on time due to uneven distribution of liquid desiccant, and then finally to improve the encapsulating effect of OLED display.

In order to make the characters and technologies of the present invention more understandable and complete, please refer to the detailed description and figures about the invention; however, it should be understood that the disclosed figures shall be considered in a descriptive sense only and not for purposes of limitation.

BRIEF DESCRIPTION OF THE DRAWING

Example embodiments will be more clearly understood from the following detailed description taken in conjunction with the accompanying drawings.

In figures.

DETAILED DESCRIPTION OF THE EMBODIMENTS

In order to make the present invention more understandable and complete, references are made to detailed descriptions set forth hereinafter in conjunction with the preferred embodiment of the invention and figures.

Please refer to FIG. 1 to FIG. 8, the invention provides an encapsulation method OLED substrate, comprising following steps:

Step 1: providing a glass cover 1 and an encapsulating substrate 5.

Figure 1:
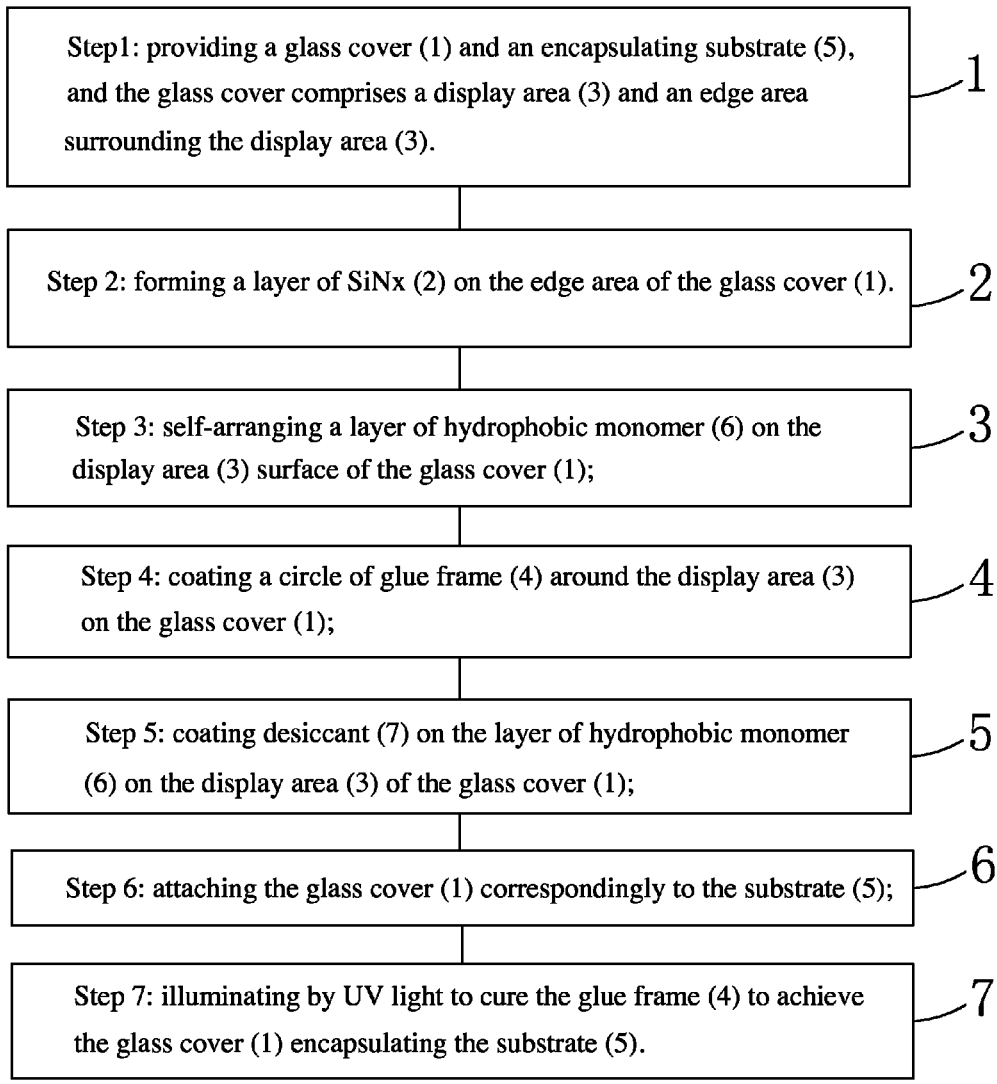
FIG. 1 is a flowchart of an encapsulation method of OLED of the invention.
Figure 2:
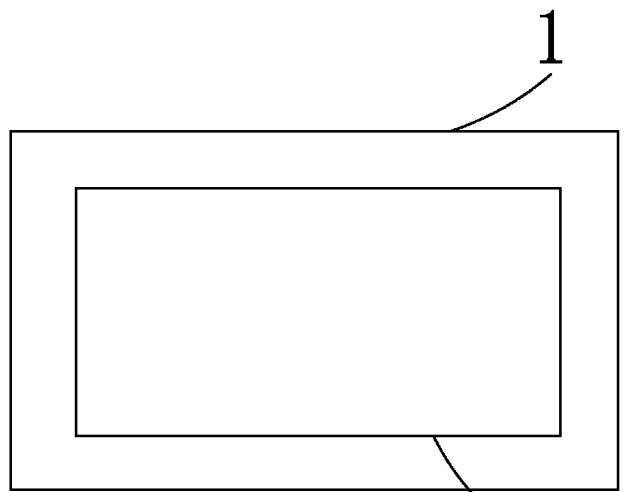
FIG. 2 is a top view providing a glass cover from step 1 of an encapsulation method of OLED of the invention.

Wherein, the substrate 5 is an OLED substrate. As shown in FIG. 2, the glass cover 1 comprising a display area 3 and an edge area which is surrounding the display area 3.

Figure 3:
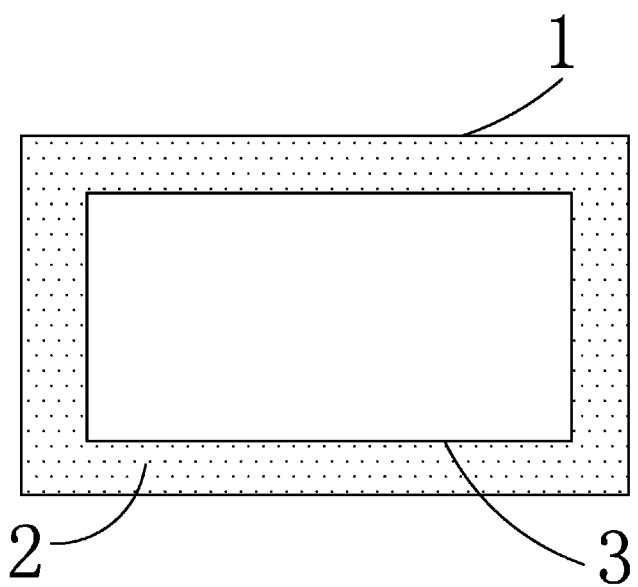
FIG. 3 is a schematic view of step 2 of an encapsulation of OLED of the invention.

Step 2: as shown in FIG. 3, forming a layer of $SiN_x$ 2 on the edge area of the glass cover 1 to ensure limiting a self-arranging area within the display area 3 in the following step 3.

Figure 4:
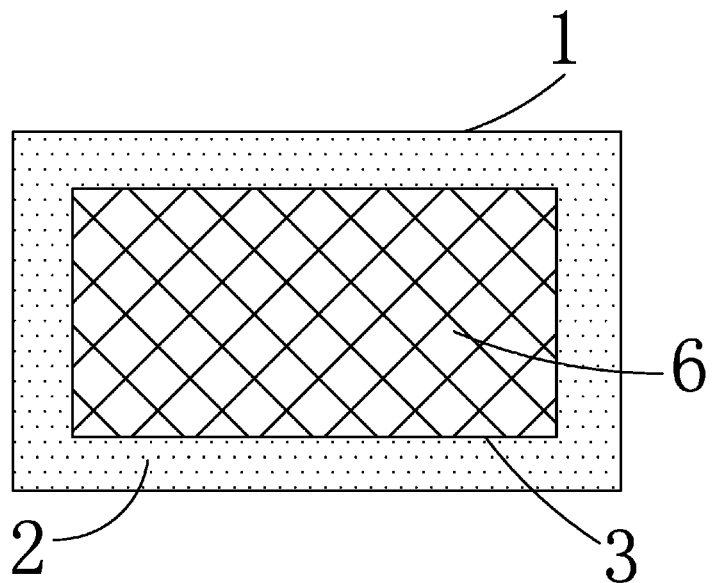
FIG. 4 is a schematic view of step 3 of an encapsulation of OLED of the invention.

Step 3: as shown in FIG. 4, self-arranging a layer of hydrophobic monomer 6 on the display area 3 surface of the glass cover 1.

Wherein, the self-arranging method is solution immersion method or evaporation. Preferably, the layer of hydrophobic monomer is silane-system molecular, which is n-propyltrichlorosilane, Trichlorooctadecylsilane, Trichlorodecylsilane, n-Decyltrimethoxysilane, n-Decyltriethoxysilane, or n-Decyltri(methoxyethoxy)silane and etc. The surface of the glass cover 1 is usually hydrophilic interface after cleaning, and liquid desiccant 7 for usage are non-polar organics in step 5. Therefore, the spreadability of liquid desiccant 7 is worse in common situation, and then causing uneven distribution of liquid desiccant 7 on glass cover surface on production, un-fill up in some portion, and then even causing glue confliction situation between glass cover 1 and substrate 5 when sudden attachment occur because bobbles cannot be ejected on time due to uneven distribution of liquid desiccant. The invention makes a character of the display area 3 surface changed from hydrophilicity to hydrophobicity by self-arranging a layer of hydrophobic monomer on the display area 3 surface of the glass cover 1, and that makes liquid desiccant has better spreadability.

Figure 5:
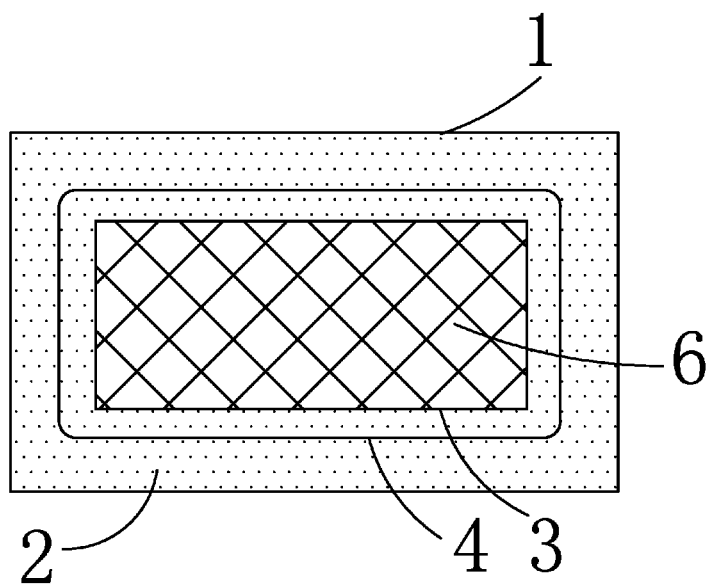
FIG. 5 is a schematic view of step 4 of an encapsulation of OLED of the invention.

As step 4 and FIG. 5 shown is coating a circle of glue frame 4 around the display area 3 on the glass cover 1.

Wherein, the glue frame 4 is coated at the edge of the glass cover 1, and a space is kept from the display area 3. The glue frame 4 is UV glue used in achieving encapsulating glass cover 1 to the substrate 5.

Figure 6:
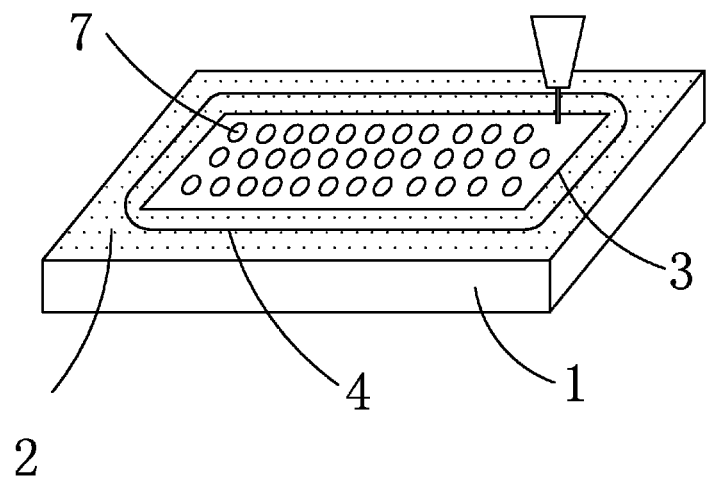
FIG. 6 is a schematic view of step 5 of an encapsulation of OLED of the invention.

As shown in step 5 and FIG. 6, desiccant 7 is coating on the layer of hydrophobic monomer 6 on the display area 3 of the glass cover 1.

The desiccant 7 is curable desiccant or non-curable desiccant.

The non-curable desiccant is aluminum polymer, which is $[R-O-Al=O]_n$ ($n \geq 1$); the curable desiccant is thermo setting liquid desiccant or UV curing liquid desiccant.

In the step 5, when the desiccant 7 is curable desiccant, heating or UV light illuminating for curing is processing after coating.

Preferably, screen printing is applied in coating desiccant 7. Liquid desiccant is non-polar organics, and the display area 3 surface of the glass cover 1 become hydrophobic due to self-arranging a layer of hydrophobic monomer 6, so liquid desiccant 7 can evenly spread on the glass cover 1.

Figure 7:
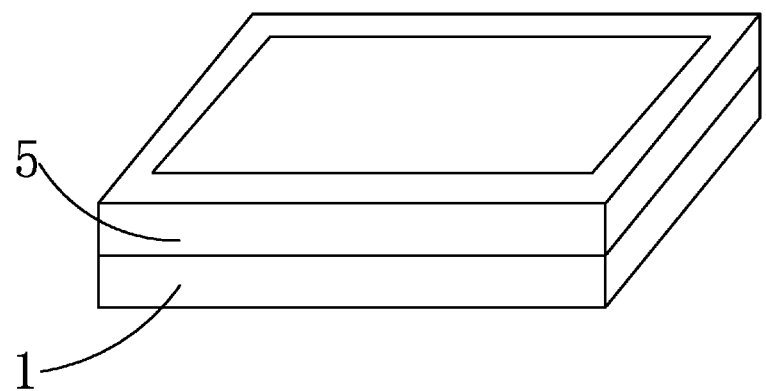
FIG. 7 is a schematic view of step 6 of an encapsulation of OLED of the invention.

As shown in step 6 and FIG. 7, the glass cover 1 and the substrate 5 can attach correspondingly in vacuum environment.

Due to even spreadability of liquid desiccant 7 on the glass cover 1 surface, solving the problem of bobble ejection on time failure caused by uneven distribution when the glass cover 1 attach correspondingly to the substrate 5, thereby effectively avoiding glue confliction situation.

Figure 8:
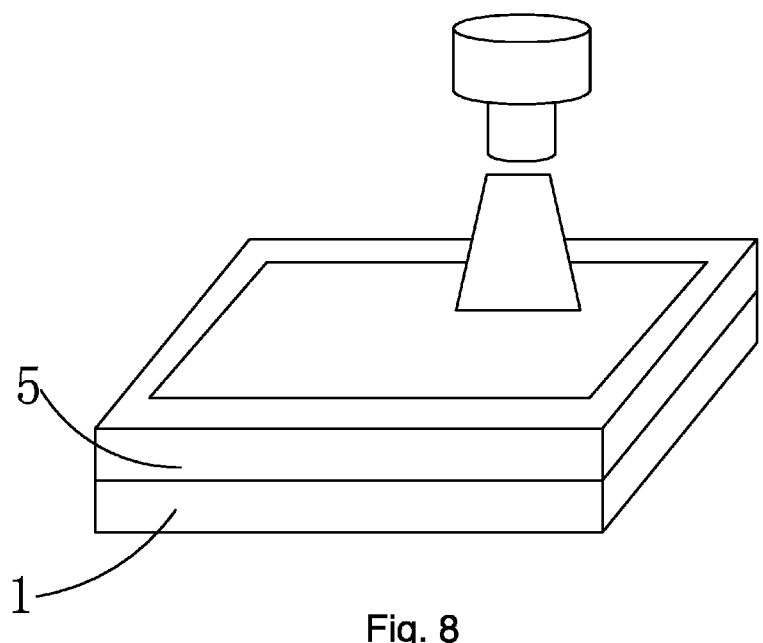
FIG. 8 is a schematic view of step 7 of an encapsulation of OLED of the invention.

Shown as step 7 and FIG. 8, illuminating by UV light to cure the glue frame 4 achieves the glass cover encapsulating the substrate 5.

In the encapsulation method, the liquid desiccant 7 can distribute evenly on the display area 3 surface of the glass cover 1, cover completely, produce bobbles free, and improve encapsulating effect of OLED display.

Figure 9:
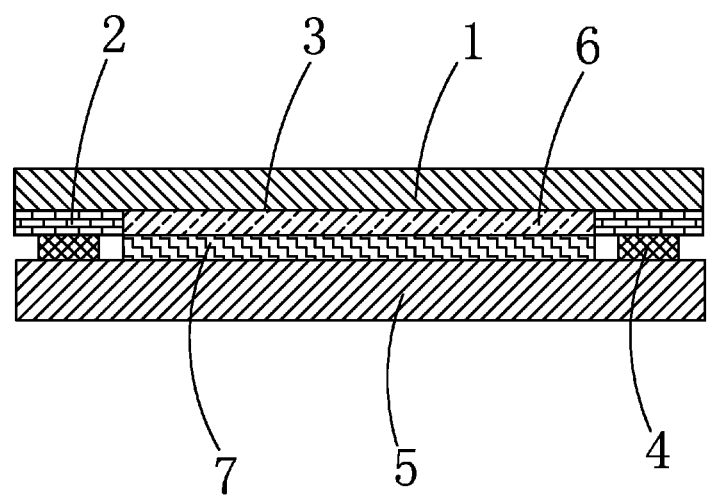
FIG. 9 is a schematic cross-sectional view of OLED structure of the invention.

Please refer to FIG. 9, based on the aforementioned encapsulation method, the invention further provides another OLED structure, comprising a substrate 5, a glass cover 1 tightly attached to the substrate 5, and a glue frame 4 positioned between the substrate 5 and the glass cover 1, which includes a display area 3 and an edge area surrounding the display area 3, and further includes a layer of $SiN_x$ 2 positioned on the edge area of the glass cover, a layer of hydrophobic monomer 6 self-arranging on the display area 3 surface of the glass cover 1, and desiccant 7 coated on the layer of hydrophobic monomer 6. The substrate 5 is OLED substrate.

The layer of hydrophobic monomer is silane-system molecular, which is n-propyltrichlorosilane, Trichlorooctadecylsilane, Trichlorodecylsilane, n-Decyltrimethoxysilane, n-Decyltriethoxysilane, or n-Decyltri(methoxyethoxy)silane and etc. The glue frame 4 is coated at the edge of the glass cover 1, and a space is kept from the display area; the glue frame 4 is UV glue.

The desiccant 7 is curable desiccant or non-curable desiccant; the non-curable desiccant is aluminum polymer, which is [R—O—Al═O]$_n$ (n≥1); the curable desiccant is thermo setting liquid desiccant or UV curing liquid desiccant.

Accordingly, the encapsulation method of OLED and the OLED structure of the invention self-arrange a layer of hydrophobic monomer on the glass cover surface by a self-arranging method on glass cover surface to modify the glass cover interface from hydrophilic interface to hydrophobic interface, thereby the liquid desiccant have well spreadability on the glass cover interface, and then avoiding causing glue confliction situation because bobbles cannot be ejected on time due to uneven distribution of liquid desiccant, and then to improve the encapsulating effect of OLED display finally.

As aforementioned description, it should be understood that the embodiments disclosed herein shall be considered in a descriptive sense only and not for purposes of limitation. Descriptions of features, advantages, or aspects of each embodiment should be considered as available for other similar features or aspects in other embodiments.

The invention claimed is:

1. An encapsulation method for OLED, comprising following steps:
   step 1: providing a glass cover and an encapsulating substrate, and the glass cover comprising a display area and an edge area surrounding the display area;
   step 2: forming a layer of SiN$_X$ on the edge area of the glass cover to encircle the display area;
   step 3: self-arranging a layer of hydrophobic monomer on and in contact with a surface of the display area of the glass cover, wherein the surface of the display area is a hydrophilic surface, the layer of SiN$_X$ is configured for limiting the layer of hydrophobic monomer within the display area;
   step 4: coating a circle of UV curable glue frame around the display area of the glass cover and on the layer of SiN$_X$ such that the layer of SiN$_X$ is located between the UV curable glue frame and the glass cover;
   step 5: coating a liquid desiccant of non-polar on the layer of hydrophobic monomer on the display area of the glass cover whereby the liquid desiccant of non-polar being distributed evenly on the display area owing to hydrophobicity of the layer of hydrophobic monomer;
   step 6: attaching the glass cover correspondingly to the substrate;
   step 7: illuminating by UV light to cure the UV curable glue frame to achieve the glass cover encapsulating the substrate.

2. The encapsulation method for OLED according to claim 1, wherein, the substrate can be an OLED substrate; a method of self-arranging the layer of hydrophobic monomer in the step 3 is solution immersion method or evaporation.

3. The encapsulation method for OLED according to claim 1, wherein, the layer of hydrophobic monomer in step 3 is silane-system molecular, which is n-propyltrichlorosilane, Trichlorooctadecylsilane, Trichlorodecylsilane, n-Decyltrimethoxysilane, n-Decyltriethoxysilane, or n-Decyltri(methoxyethoxy)silane.

4. The encapsulation method for OLED according to claim 1, wherein, the glue frame is coated at the edge of the glass cover in the step 4, and a space is kept from the display area; the glue frame is UV glue.

5. The encapsulation method for OLED according to claim 1, wherein, screen printing is applied in coating a liquid desiccant of non-polar in the step 5; the step 6 is processing in vacuum environment.

6. The encapsulation method for OLED according to claim 1, wherein, the liquid desiccant of non-polar is curable desiccant or non-curable desiccant.

7. The encapsulation method for OLED according to claim 6, wherein, the non-curable desiccant is aluminum polymer, which is [R—O—Al═O]$_n$ (n≥1); the curable desiccant is thermo setting liquid desiccant or UV curing liquid desiccant.

8. The encapsulation method for OLED according to claim 6, wherein, when the liquid desiccant of non-polar is curable desiccant in step 5, heating or UV light illuminating for curing is processing after coating.

9. An OLED structure, comprising a substrate, a glass cover tightly attached to the substrate, and a UV cured glue frame positioned between the substrate and the glass cover; wherein the glass cover includes a display area and an edge area surrounding the display area, and further includes a layer of SiN$_X$ positioned on the edge area of the glass cover to encircle the display area, a layer of hydrophobic monomer self-arranging on a surface of the display area of the glass cover, and desiccant of non-polar coated on the layer of hydrophobic monomer on the display area of the glass cover; the layer of SiN$_X$ is configured for limiting the layer of hydrophobic monomer within the display area, the UV cured glue frame is on the layer of SiN$_X$ such that the layer of SiN$_X$ is located between the UV cured glue frame and the glass cover, the desiccant of non-polar is distributed evenly on the display area due to hydrophobicity of the layer of hydrophobic monomer.

10. The encapsulation method for OLED according to claim 9, wherein, the substrate is OLED substrate; the layer of hydrophobic monomer is silane-system molecular; the UV cured glue frame is coated at the edge of the glass cover and a space is kept from the display area; the desiccant of non-polar is curable desiccant or non-curable desiccant.

11. An OLED structure, comprising a substrate, a glass cover tightly attached to the substrate, and a UV cured glue frame positioned between the substrate and the glass cover; wherein the glass cover includes a display area and an edge area surrounding the display area, and further includes a layer of SiN$_X$ positioned on the edge area of the glass cover to encircle the display area, a layer of hydrophobic monomer self-arranging on and in contact with a surface of the display area of the glass cover, and desiccant of non-polar coated on the layer of hydrophobic monomer on the display area of the glass cover; the layer of SiN$_X$ is configured for limiting the layer of hydrophobic monomer within the display area, the UV cured glue frame is on the layer of SiN$_X$ such that the layer of SiN$_X$ is located between the UV cured glue frame and the glass cover, the desiccant of non-polar is distributed evenly on the display area due to hydrophobicity of the layer of hydrophobic monomer;
   wherein, the substrate is OLED substrate; the layer of hydrophobic monomer is silane-system molecular; the UV cured glue frame is coated at the edge of the glass cover and a space is kept from the display area; the desiccant of non-polar is curable desiccant or non-curable desiccant.

* * * * *